United States Patent [19]
Nicewarner, Jr.

[11] Patent Number: 5,327,325
[45] Date of Patent: Jul. 5, 1994

[54] THREE-DIMENSIONAL INTEGRATED CIRCUIT PACKAGE

[75] Inventor: Earl R. Nicewarner, Jr., Gaithersburg, Md.

[73] Assignee: Fairchild Space and Defense Corporation, Germantown, Md.

[21] Appl. No.: 14,516

[22] Filed: Feb. 8, 1993

[51] Int. Cl.⁵ .................. H05K 7/02; H01L 23/02
[52] U.S. Cl. .................. 361/760; 361/730; 174/52.2; 174/52.4; 257/686; 257/787
[58] Field of Search ........... 257/685, 686, 684, 701, 257/702-704, 777-778, 787; 361/390, 392, 393, 394, 395, 399, 400-403, 417, 418; 174/52.1, 52.2, 52.3, 52.4

[56] References Cited

U.S. PATENT DOCUMENTS 4,818,821 4/1989 Wentworth et al. ............ 174/52.4
4,827,082 5/1989 Horiuchi et al. ............... 174/52.4
5,168,126 12/1992 Matsumoto et al. .

FOREIGN PATENT DOCUMENTS 59-84557  5/1984 Japan ........................ 257/685
62-122161 6/1987 Japan ........................ 257/685
3255657  11/1991 Japan ........................ 257/777

Primary Examiner—Leo P. Picard
Assistant Examiner—Bot Ledinh
Attorney, Agent, or Firm—Michael W. York

[57] ABSTRACT

An integrated circuit package that permits high density packaging of circuit chips. The integrated circuit package has a base substrate support member with an upper and a lower surface. A cavity is located in its upper surface and a similar cavity is located in its lower surface. Two circuit chips are located in each cavity that are connected together in back to back relationship. The cavities are closed or sealed by lids that are bonded to mounting surfaces that are located on the base substrate support member and surround the cavities. A series of terminating leads are located on two sides of the base substrate support member that are electrically connected to the circuit chips. A single cavity embodiment is also set forth that is designed for use when a lesser density is acceptable or desired.

7 Claims, 4 Drawing Sheets

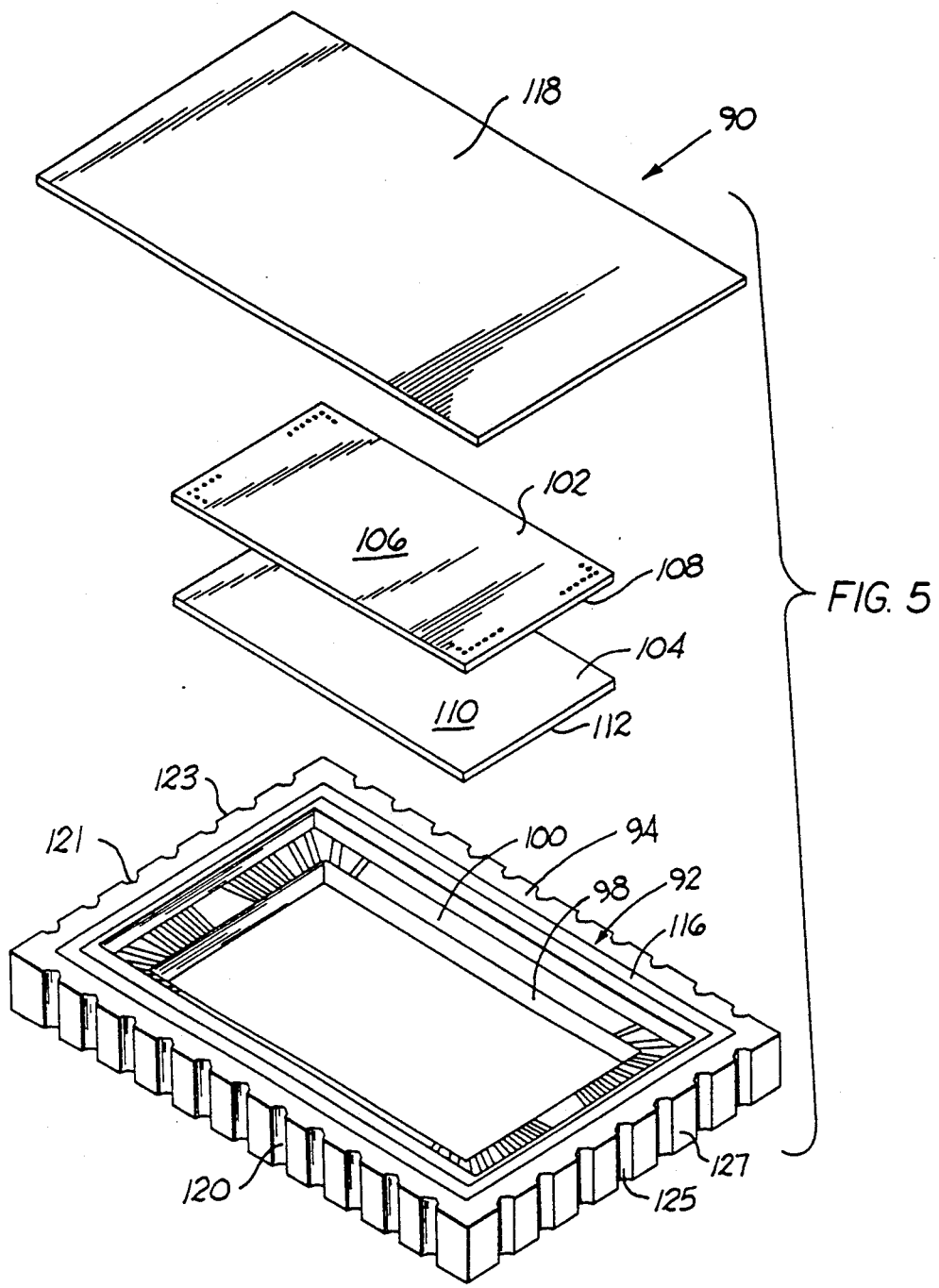
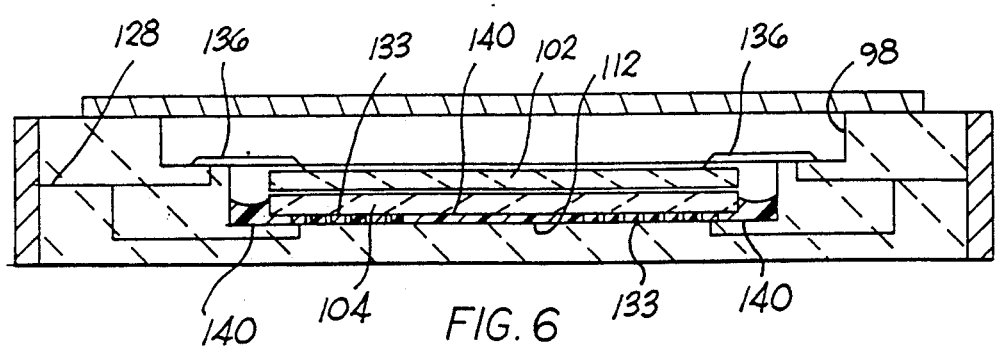
FIG. 5
FIG. 6

THREE-DIMENSIONAL INTEGRATED CIRCUIT PACKAGE

BACKGROUND OF THE INVENTION

The increased complexity of spacecraft and aircraft as well as other vehicles has resulted in a need to incorporate more and more electronic systems in such vehicles. However, the complexity has reached a point where the required and desired electronic systems exceed the available space in the vehicle to accept all such systems. In order to overcome this problem, numerous efforts have and are being made to reduce the size of the electronic packages that make up such electronic systems.

Electronic system evolution has followed the trend of producing more functionality in less volume, at lower weight, and lower cost. Improvements in integrated circuit chip density and functionality have mostly contributed toward improved efficiency, however, advancements in packaging of these devices have also been beneficial. As it becomes more difficult to achieve substantial improvements through integrated circuit technology advances, new packaging approaches have become necessary to obtain density improvements and to allow the full performance potential of interconnected chips to be used.

The term "chip" in this description refers to an electrically functional integrated circuit die. The active face of the chip is defined as the surface on which the integrated electronics have been disposed. The back side refers to the surface opposite the active face.

It is known to place an integrated circuit chip in a ceramic package for protection and then solder the package to a substrate. Typical integrated circuit packages contain only one chip. The package is substantially larger than the chip, thereby limiting the overall packaging density. Conventional packaging systems employing printed circuit boards with single chip packages are unable to provide the required number of chips within a volume and weight which is compatible with the needs of advanced circuit applications.

The present invention relates to integrated circuitry packaging to increase its functional density, through use of a three-dimensional arrangement, and reduce material and assembly cost. Applications which require large memory capacity suffer from excessive packaging overhead when single chip packages are used.

This invention makes it possible to dispose two or four integrated circuits in a package of similar size to one that would ordinarily contain a single integrated circuit chip. This invention also permits the forming of multiple arrays of stacked pairs of chips contained on a substrate. The techniques of this invention are applicable for use with any form of commercially available chip.

Thus, there is provided a ceramic, or other low expansion substrate material, with a means for allowing mechanical and electrically functional attachment of integrated circuit chips to both sides of the substrate using flip-chip assembly techniques. In addition, there is provided an integrated circuit package that permits the stacking of the integrated circuit chips in a back to back manner on one or both sides of a substrate to allow additional use of the vertical space above or below the substrate. This creates a three dimensional arrangement of chips for more effective use of substrate area and allows more chips to be contained in a given volume. The substrate additionally provides an interconnect method for these stacked chips by means of internal vias and circuitry. The integrated circuit packages described herein increase the density (volumetric efficiency) by up to four times over existing approaches in order to provide higher density, lower weight, and improved functional performance for electronic systems.

SUMMARY OF THE INVENTION

This invention relates to packaging of electronic circuits and more particularly to electronic circuitry that uses less volume.

Accordingly, it is an object of the invention to provide an electronic circuit package with reduced volume and lower cost.

It is an object of the invention to provide an integrated circuit package that provides increased functionality with reduced volume.

It is an object of the invention to provide an integrated circuit package with increased functional density.

It is an object of the invention to provide an integrated circuit package that is well suited for use in circuits where the volume available for the circuit is limited.

It is an object of the invention to provide an integrated circuit package that is well suited for use in a variety of difficult situations.

It is an object of the invention to provide an integrated circuit package that is well suited for use in space.

It is an object of the invention to provide an integrated circuit package that is well suited for use in aircraft.

It is an object of the present invention to provide an integrated circuit package that is well suited for use in ballistic applications.

It is an object of the invention to provide an integrated circuit package that permits multiple integrated circuits to be packaged in the same size of package that would contain a single integrated circuit chip.

It is an object of the invention to provide an integrated circuit package that allows a pair of stacked chips to be contained on a substrate.

It is an object of the invention to provide an integrated circuit package that allows multiple pairs of stacked chips to be contained on a substrate.

It is an object of the invention to provide an integrated circuit package that is adapted for use with a wide variety of available chips.

It is an object of the invention to provide an integrated circuit package that is adapted for use with any form of commercially available chip.

It is also an object of the invention to provide an integrated circuit package that creates a three dimensional arrangement of chips.

It is also an object of the invention to provide an integrated circuit package made from a low expansion substrate material.

It is an object of the invention to provide an integrated circuit package that allows attachment of integrated circuit chips to both sides of a substrate.

It is an object of the invention to provide an integrated circuit package with a substrate that allows mechanical and electrical functional attachment of integrated circuit chips to both sides of a substrate.

It is an object of the invention to provide an integrated circuit package that is configured to allow additional use of the space above or below a substrate.

It is an object of the invention to provide an integrated circuit package that effectively increases the packaging density by up to four times that over existing packaging techniques.

It is an object of the invention to provide an integrated circuit package with special means for mounting, stacking, and functionally interconnecting chips so as to provide increased functional density.

It is also an object of the present invention to provide an integrated circuit package with means for attaching integrated circuits to a substrate which optimizes package and chip density.

It is another object of the invention to provide an integrated circuit package that uses novel packaging technology to provide a variety of high density packages for chips useful for a variety of applications.

It is still another object of this invention is to provide an integrated package which is suitable for use with standard commercial chips of various dimensions.

It is a further object of this invention to provide an integrated circuit package with efficient means for the interconnection of the chips in a high density package.

These and other objects will be apparent from the integrated circuit package invention that has a base substrate support member with an upper and a lower surface with a cavity located in its upper surface and a similar cavity located in its lower surface. Two circuit chips are located in each cavity that are connected together in back to back relationship. The cavities are closed or sealed by lids that are bonded to sealing surfaces that are located on the base substrate support member and surround the cavities. A series of termination leads are located on two sides of the base substrate support member that are electrically connected to the circuit chips. The invention also includes a single cavity embodiment that is designed for use when a lesser density is acceptable or desired to reduce overall package thickness.

BRIEF DESCRIPTION OF THE DRAWINGS

The invention will be hereinafter more fully described with references to the accompanying drawings in which:

FIG. 5 is an exploded perspective view of the of the three dimensional integrated circuit package invention set forth in FIG. 4; and FIG. 6 is an enlarged sectional view of the three dimensional integrated circuit package invention taken substantially on the line 6—6 of FIG. 4, but with its cover in place.

DETAILED DESCRIPTION OF THE PREFERRED EMBODIMENTS

Figures 1, 3:
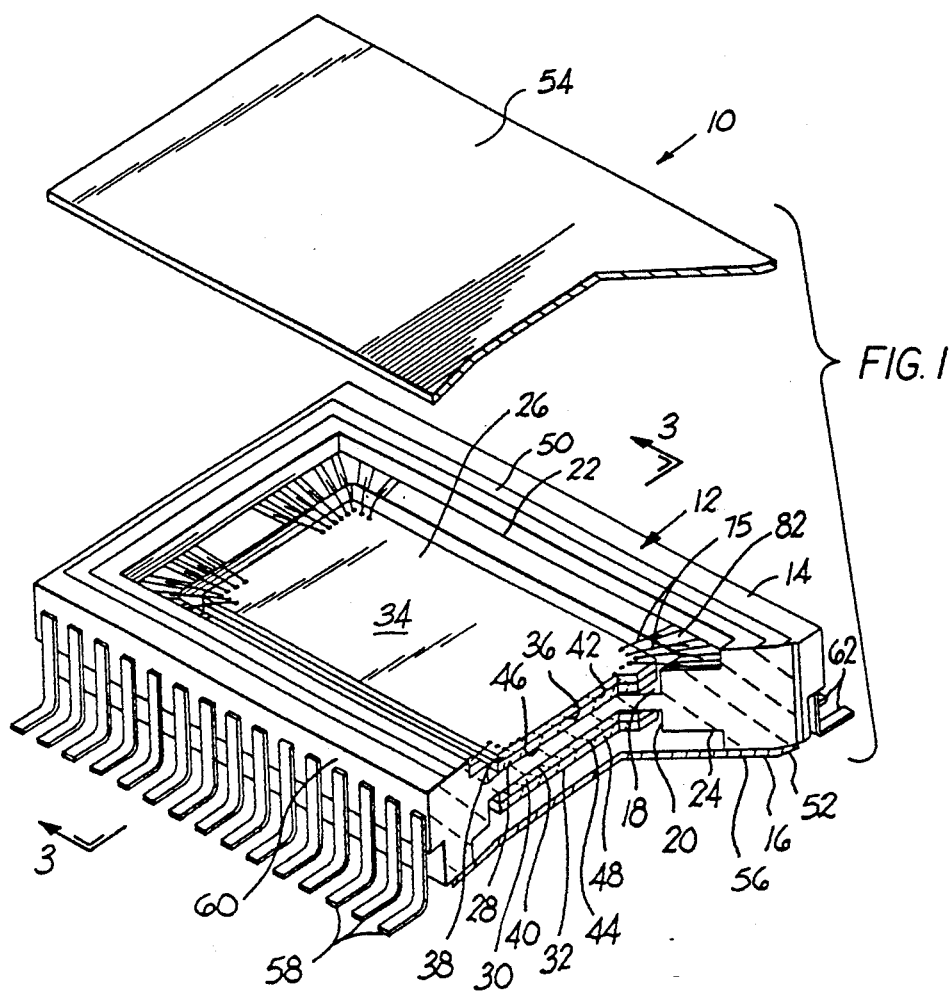
FIG. 1 is a perspective view of the three dimensional integrated circuit package invention with its cover removed to illustrate its interior.
FIG. 3 is an enlarged sectional view of the three dimensional integrated circuit package invention taken substantially on the line 3—3 of FIG. 1, but with its cover in place.
Figure 2:
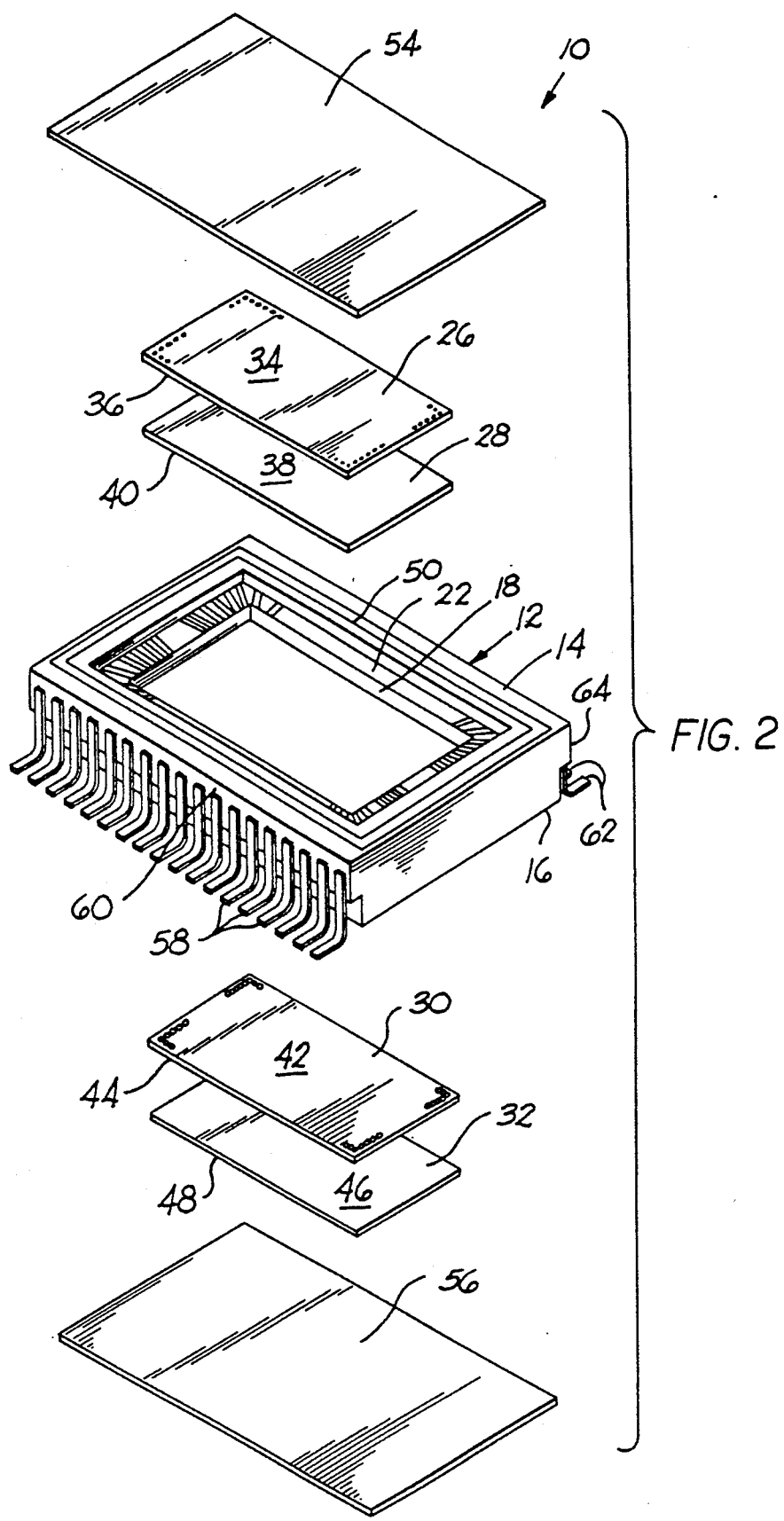
FIG. 2 is an exploded perspective view of the of the three dimensional integrated circuit package invention set forth in FIG. 1.

Referring first to FIGS. 1, 2, and 3, one embodiment of the three dimensional integrated circuit package invention is illustrated and is designated generally by the number 10. The three dimensional integrated circuit package 10 comprises a generally rectangular shaped base substrate support member 12 that has an upper substantially flat surface 14 and a lower substantially flat surface 16. A substantially rectangular shaped cavity 18 is located in the upper flat surface 14 of the base substrate support member 12 and another substantially identical substantially rectangular shaped cavity 20 is located in the lower flat surface 16 of the base substrate support member 12. The two cavities 18 and 20 are separated by a partition 21 that is part of the substrate support member 12. A substantially rectangular shaped recess 22 is located around the entrance to the cavity 18 in the upper flat surface 14 of the base substrate support member 12 and another substantially identical substantially rectangular shaped recess 24 is located around the entrance to the cavity 20 in the lower flat surface 16 of the base substrate support member 12.

The three dimensional integrated circuit package 10 also comprises two chips or circuit die 26 and 28 located within the cavity 18 in the upper surface 14 of the base substrate support member 12 and two chips or circuit die 30 and 32 located within the cavity 20 in the lower surface 16 in the base substrate support member 12. Each of the chips 26, 28, 30 and 32 have the respective front and back sides 34, 36, 38, 40, 42, 44, and 46, 48. The chips 26 and 28 are located so that their back sides 36 and 38 are connected together in a back to back relationship and the chips 30 and 32 are located so that their back sides 44 and 46 are connected together in a back to back relationship.

The three dimensional circuit package 10 also comprises a generally rectangular shaped lid mounting surface 50 that extends completely around the cavity 18 and the adjacent recess 22 in the upper surface 14 of the base substrate support member 12 and another generally rectangular shaped lid mounting surface 52 that extends completely around the cavity 20 and the adjacent recess 24 in the lower surface 16 of the base substrate support member 12. The three dimensional circuit package 10 also comprises a substantially flat generally rectangular shaped thin lower lid member 56. The upper lid member 54 is bonded using techniques known in the art to upper mounting surface 50 and the lower lid member 56 is bonded in a similar manner to the lower mounting surface 52.

The three dimensional circuit package 10 also comprises a series of termination leads designated by the number 58 located on one side 60 of the base substrate support member 12 and a similar series of termination leads designated by the number 62 located on the other side 64 of the base substrate support member 12. The leads 58 are connected to the chips 26, 28, 30 and 32 via the conductive layers 76 and 78 and wire bond connections such as the connections 75 and 77 that are connected to the respective chips 26 and 32 and the leads 62 are also connected to the chips 26, 28, 30 and 32 via the conductive layers 76 and 78 and wire bond connections such as the connections 75. The chips 26 and 28 are also connected electrically to the chips 30 and 32 by the vias 65, 66, 67, 68, 69 and 70 in the base substrate support member 12.

Flip-chip solder bond connections 71 and 73 are located on the respective inner sides or surfaces 40 and 42 of the respective inner chips 28 and 30 that are located in the respective cavities 18 and 20 adjacent the surfaces of the partition 21. The flip-chip solder bond connections 71 and 73 are encapsulated by a suitable epoxy or other suitable resin material 80 and 83. As used herein the term "flip-chip" refers to a known method of chip or integrated circuit attachment to a substrate. With this method the chip is flipped so that the connecting conductor pads on the active face of the chip are attached using direct connection with reflowed solder to a corresponding mirror image pattern on the substrate.

Figure 4:
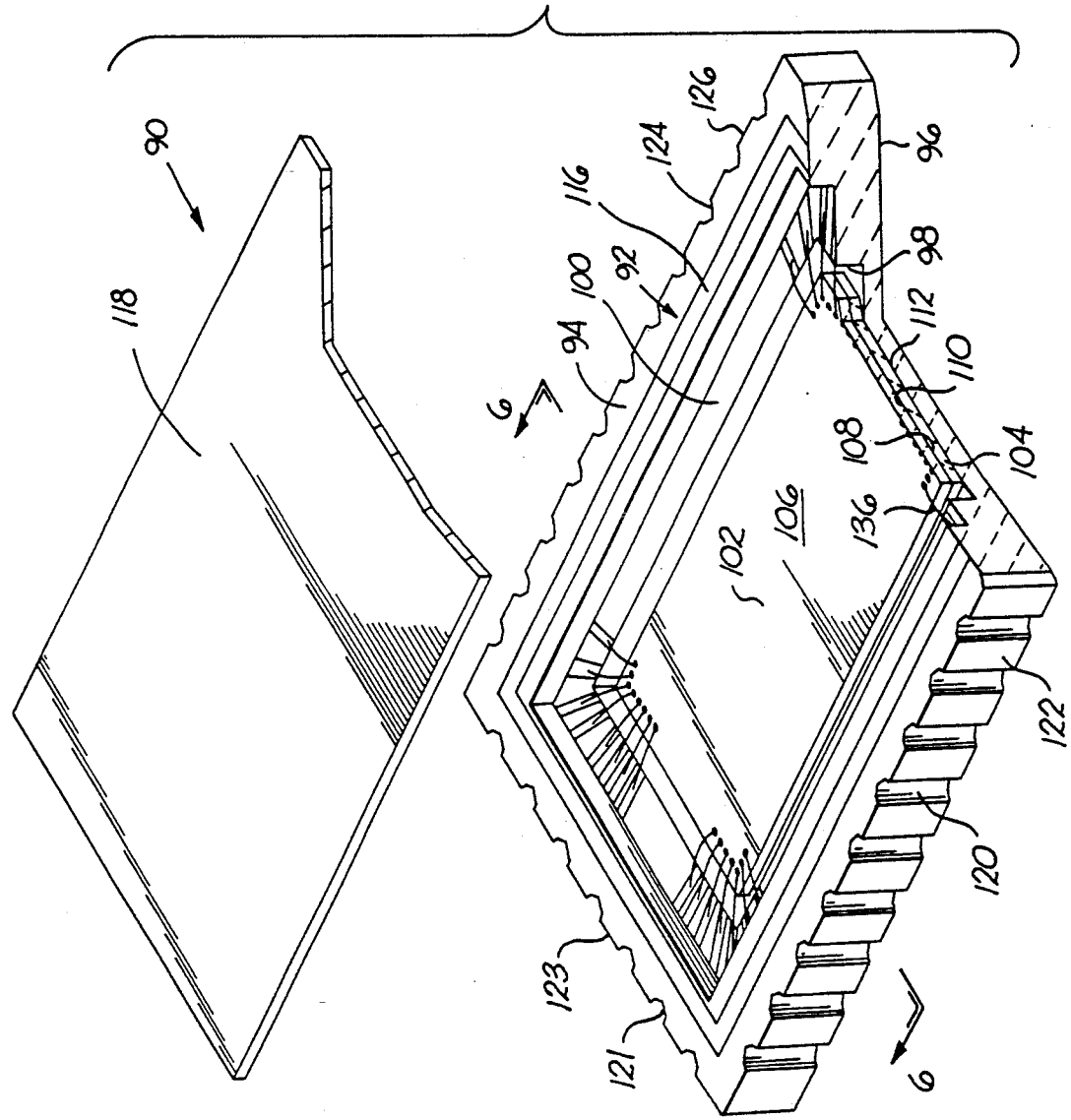
FIG. 4 is a perspective view of an additional embodiment of the three dimensional integrated circuit package invention with its cover removed to illustrate its interior.

Another embodiment of the three dimensional circuit package invention is illustrated in FIGS. 4 through 6 and is designated generally by the number 90. The three dimensional integrated circuit package 90 comprises a generally rectangular shaped base substrate support member 92 that has an upper substantially flat surface 94 and a lower substantially flat surface 96. A substantially rectangular shaped cavity 98 is located in the upper flat surface 94, but there is no cavity in the lower flat surface 96 as is the case with the previous three dimensional circuit package 10 and its base substrate support member 12. A substantially rectangular shaped recess 100 is located around the entrance to the cavity 98 in the upper flat surface 94 of the base substrate support member 92.

The three dimensional integrated circuit package 90 also comprises two chips or circuit die 102 and 104 located within the cavity 98 in the upper flat surface 94 in the base substrate support member 92. Each of the chips 102 and 104 have respective front and back sides 106 and 108 and 110 and 112 and the chips 102 and 104 are located with their back sides 108 and 110 connected together in a back to back relationship. The three dimensional circuit package 90 also comprises a generally rectangular shaped lid mounting surface 116 that extends completely around the cavity 98 and the adjacent recess 100 in the upper substantially flat surface 94 of the base substrate support member 92. The three dimensional integrated circuit package 90 also comprises a substantially flat generally rectangular shaped thin lid member 118 that is bonded using techniques known in the art to the mounting surface 116.

The three dimensional circuit package 90 also includes a series of termination pads designated by the number 120 located on one side 122 of the base substrate support member 92 and a similar series of termination pads designated by the number 124 located on the other side 126 of the base substrate support member 92. The three dimensional circuit package 90 also includes a series of termination pads designated by the number 121 located on one side or end 123 of the base substrate support member 92 and a similar series of termination pads designated by the number 125 located on the opposite side or end 126 of the base substrate support member 92. The pads 120 are connected to the chip 102 via the conductive layer 128 and the wire bond connections such as the connection 136 that are connected to the chip 102. The pads 124 are also connected to the chip 102 via the conductive layer 128 and the wire bond connections such as the connections 136 that are connected to the chip 102.

Flip-chip solder bond connections 133 are located on the inner side or surface 112 of the inner chip 104 that is located in the cavity 98 adjacent the bottom surface of the cavity 98. The flip-chip solder bond connections 133 are encapsulated by a suitable epoxy or other resin material 140. The connections for the pads 121 and 125 are similar to those for the pads 120 and 124 and hence are not discussed in detail since the manner of making these connections will be obvious to one skilled in the art.

The three dimensional integrated circuit package invention 10 is manufactured in the following manner. The two cavity embodiment is discussed since it is more complex than the single cavity embodiment 90. However the same manufacturing procedures are used for the single cavity embodiment 90.

First, a co-fired ceramic package or substrate support member 12 is fabricated from mullite that is available from Kyocera America, Inc. of San Diego, Calif. with custom interface patterns for electrical interconnect to the chips as well as required internal inter-connections necessary to produce an electrically functional module. Mullite is used to provide a close match between the coefficient of expansion of the chip and the package material so as to prevent excessive strain in the flip-chip solder connections during exposure to temperature extremes. The co-fired package or substrate support member 12 contains the two identical cavities 18 and 20 separated by the partition 21. The partition 21 between the cavities 18 and 20 contains contact sites on each side which correspond to the selected chip bond site pattern. The contact sites are gold plated over nickel over the basic ceramic metallization, typically tungsten.

The illustrative example here is for use with a memory chip 26, 28, 30 and 32 containing thirty-two chip interconnect locations. The four chips 26, 28, 30 and 32 are to be interconnected such that all but one of the thirty-two interconnect locations are common to each other. The one unique connection for chip select function requires a separate package output termination for each chip 26, 28, 30 and 32. The total number of package terminations required is thus thirty-two plus the number of chips used minus one, or thirty-five for this example. An even number of terminations, thirty-six, would be used to keep the package symmetrical.

Additional interconnect sites are provided in the package on the shelf layers for the wire bond or tape automated bonding (TAB) interconnect. The connection sites are custom designed to closely match the bond site pattern for the chips so that short wire bond or TAB connections result. Since the package 10 is intended to be hermetic, a metallized lid surface mounting area or surface 50 or 52 is located on the ceramic package or substrate support member 12 on each side 14 or 16. This allows for brazing or soldering of the respective lids 54 or 56 to the substrate support member 12. Localized temperature application during the lid 54 and 56 attachment process is required in order to limit package temperature during the soldering or brazing operation so that the flip-chip solder connections are not disturbed and the encapsulating resin is not adversely affected by high temperature exposure that would cause the resin to degrade.

Integrated circuit chips 28 and 30 which are to be mounted using flip-chip technique are prepared, using known art, in wafer form with solder bumps of Sn5Pb95 solder alloy or similar solder alloy at the attachment pads. The wafer is ground on its back side to achieve an overall thickness of approximately 0.010 of an inch in order to reduce stacked height and volume. Chips are removed from the wafer. Integrated circuit chips 26 and 32 which are to be wire bonded are also obtained in chip form with the desired thickness of 0.010 of an inch. The chips 26 and 32 may also be obtained mounted in a TAB frame with outer leads designed for subsequent interconnect to the package. Flux is applied to the solder bumped chip or package cavity 18 or 20. A solder bumped chip is placed into the upward facing package cavity 18 or 20 with proper alignment between the chip bumps and corresponding interconnect pads in the package. The assembly is then reflowed using an infrared oven or conduction heating system in an inert gas atmosphere, such as nitrogen at approximately 350 degrees Centigrade. After reflow and cooling, the assembly is cleaned of flux using a solvent such as xylene or isopropyl alcohol.

The package is inverted and the package/chip combination 10 is placed on a supporting fixture (not shown). This fixture is designed to support the inverted chip during subsequent reflow in order to prevent it from falling off due to gravity. The fixture supports the package and chip such that the distance from the chip to the package is allowed to increase slightly as the solder melts without allowing the chip to fall off during reflow. Surface tension will maintain the solder connection so long as the gap does not become too great.

The previously described process is then repeated for the second chip cavity 18 or 20. If desired for reliability enhancement, the cavity 18 or 20 between the chip and the package, where the solder bumps are located, is encapsulated by injecting epoxy resin, such as Hysol FP4510 available from Dexter Electronic Materials Division of The Dexter Corporation of Industry, Calif. around one or two sides of the chip. Surface tension will draw the resin under the chip and fill the cavity between the chip and package. The resin is then cured by heating the assembly at the time and temperature recommended by the resin manufacturer. An additional chip, without solder bumps, is bonded using a suitable adhesive, such as an epoxy film adhesive, to the back of a previously installed chip. This chip utilizes wire bond pad attachments or is mounted in a TAB tape carrier. The upper chip is wire bonded or outer lead bonded (for TAB) to the package metallization on the shelf layer. The package 10 is inverted and this process is repeated. The lid 54 or 56 is brazed or soldered to the package using known techniques that limit temperature to less than will cause chip solder connection reflow or degradation to the encapsulating resin. The package 10 is inverted and a lid 54 or 56 is brazed or soldered to the package on the other side.

The invention embodiments 10 and 90 are used in the following manner. To use the three dimensional circuit package embodiment 10 it is located at a suitable location in an electronic circuit (not shown) and then its termination leads 58 and 60 are soldered to suitable connecting points in the electronic circuit using known techniques. In a similar manner, the three dimensional circuit package embodiment 90 is located at a suitable location in an electronic circuit (not shown) and then its termination pads 120, 121, 125, and 124 are soldered to suitable connecting points in the electronic circuit using known techniques.

The present invention is well adapted to carry out the objects and attain the ends and advantages mentioned, as well as others inherent therein. Although the invention has been described in considerable detail with reference to certain preferred embodiments it will be appreciated and understood that various changes and modifications may be made without departing from the spirit and scope of the invention as defined in the appended claims.

What is claimed is:

1. An integrated circuit package comprising a base substrate support member having an upper side and a lower side, said base substrate support member having a cavity in the upper side thereof and a cavity in the lower side thereof separated by a partition in said base substrate support member, a plurality of chips located in the cavity in the upper side of said base substrate support member, a plurality of chips located in the cavity in the lower side of said base substrate support member, said chips located in the cavity in the upper side of said base substrate support member having a back and being located in a back to back relationship and said chips located in the cavity in the lower side of said base substrate support member having a back and being located in a back to back relationship, said chips located in the cavity in the upper side of said base substrate support member being electrically connected to said chips located in the cavity in the lower side of said base substrate support member and means for closing the cavities in the upper and the lower sides of said base substrate support structure.

2. The integrated circuit package of claim 1 wherein said chips located in the cavity in the upper side of said base substrate support member are electrically connected to said chips located in the cavity in the lower side of said base substrate support member by electrical connections extending through the partition in said base substrate support member between the cavity in the upper side of said base substrate support member and the cavity in the lower side of said base substrate support member.

3. The integrated circuit package of claim 2 wherein at least some of said chips located in the cavity in the upper side of said base substrate support member are connected by flip-chip solder connections and wherein at least some of said chips located in the cavity in the lower side of said base substrate support member are connected by flip-chip solder connections.

4. The integrated circuit package of claim 3 wherein said flip-chip solder connections are encapsulated.

5. The integrated circuit package of claim 4 further comprising a series of input/output leads associated with said base substrate support member.

6. The integrated circuit package of claim 5 further comprising means for connecting at least some of said chips located in the cavity in the upper side of said base substrate support member and at least some of said chips located in the cavity in the lower side of said base substrate support member to at least some of said input/output leads.

7. The integrated circuit package of claim 6 wherein said connecting means comprise wire bond connections.

* * * * *